United States Patent
Kim

(10) Patent No.: US 11,245,275 B2
(45) Date of Patent: Feb. 8, 2022

(54) ELECTRONIC DEVICE INCLUDING HOLDER AND WIRELESS CHARGING DEVICE FOR CAR

(71) Applicant: Samsung Electronics Co., Ltd., Gyeonggi-do (KR)

(72) Inventor: Jinwook Kim, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 82 days.

(21) Appl. No.: 16/870,286

(22) Filed: May 8, 2020

(65) Prior Publication Data
US 2020/0358301 A1    Nov. 12, 2020

(30) Foreign Application Priority Data
May 10, 2019    (KR) .................. 10-2019-0055054

(51) Int. Cl.
| | | |
|---|---|---|
| *H01M 10/46* | (2006.01) | |
| *H02J 7/00* | (2006.01) | |
| *H05K 7/20* | (2006.01) | |
| *H02J 50/12* | (2016.01) | |
| *H02J 7/02* | (2016.01) | |

(52) U.S. Cl.
CPC .............. *H02J 7/0044* (2013.01); *H02J 7/02* (2013.01); *H02J 50/12* (2016.02); *H05K 7/20909* (2013.01)

(58) Field of Classification Search
CPC .......... H02J 7/0044; H02J 7/0042; H02J 7/02; H02J 50/12; H02J 50/20; H02J 50/005; H05K 7/20172; H01F 27/085; H01F 27/2876; H01F 27/02
USPC ................. 320/107, 108, 114, 115, 150, 153
See application file for complete search history.

(56) References Cited

U.S. PATENT DOCUMENTS

| 10,219,407 B2* | 2/2019 | Lofy ................. H05K 7/20845 |
| 10,886,875 B2* | 1/2021 | Walker ................. G06F 1/1635 |
| 2007/0152633 A1* | 7/2007 | Lee ....................... G06F 1/1632 |
| | | 320/114 |

(Continued)

FOREIGN PATENT DOCUMENTS

| CN | 207835535 | 9/2007 |
| KR | 1020070073221 | 7/2007 |

(Continued)

OTHER PUBLICATIONS

International Search Report dated Aug. 28, 2020 issued in counterpart application No. PCT/KR2020/006067, 8 pages.

*Primary Examiner* — Edward Tso
(74) *Attorney, Agent, or Firm* — The Farrell Law Firm, P.C.

(57) ABSTRACT

An electronic device is provided. The electronic device includes a main body; an intake hole formed at a first face facing a first direction in the main body; a fan disposed inside the main body and pulling air through the intake hole; a charging device disposed between the fan and a second face facing a second direction opposite to the first direction in the main body, and the charging device including a coil that supplies power to an external electronic device; a plurality of holders disposed to a side face in the main body, the plurality of holders holding the external electronic device mounted on the second face; and a holder flow path that provides the air, which is circulated by the fan to each of the plurality of holders, toward the external electronic device.

20 Claims, 12 Drawing Sheets

(56) References Cited

U.S. PATENT DOCUMENTS

| | | | |
|---|---|---|---|
| 2013/0307470 A1 | 11/2013 | Watanabe et al. | |
| 2014/0125277 A1* | 5/2014 | Van Wiemeersch | H02J 50/12 320/108 |
| 2015/0355693 A1* | 12/2015 | Chang | H05K 5/0086 361/679.48 |
| 2017/0110902 A1 | 4/2017 | Miller et al. | |
| 2019/0109474 A1 | 4/2019 | Yang et al. | |
| 2019/0273386 A1 | 9/2019 | Zeng | |

FOREIGN PATENT DOCUMENTS

| | | |
|---|---|---|
| KR | 20170028137 | 3/2017 |
| KR | 20180039354 | 4/2018 |
| WO | WO 2014/008423 | 1/2014 |

* cited by examiner

ELECTRONIC DEVICE INCLUDING HOLDER AND WIRELESS CHARGING DEVICE FOR CAR

CROSS REFERENCE TO RELATED APPLICATION(S)

This application is based on and claims priority under 35 U.S.C. § 119 to Korean Patent Application No. 10-2019-0055054, filed on May 10, 2019, in the Korean Intellectual Property Office, the entire disclosure of which is incorporated herein by reference.

BACKGROUND

1. Field

The disclosure relates generally to an electronic device and a wireless charging device for a car, and more particularly, to an electronic device including a holder having a flow path and a wireless charging device for a car.

2. Description of Related Art

Power consumption of a portable electronic device may gradually increase in order to provide high performance and multi-functionality. The electronic device may always activate a display when watching video or driving a navigation app. The power consumption of the electronic device may increase as the display is always activated.

Charging the electronic device is required often when the electronic device executes an application which consumes a great amount of power. For supplying power, the portable electronic device may supply power by coupling a power line to an interface of a portable terminal, or may be wirelessly charged by being electromagnetically operated with a coil of a wireless charging device. A wireless charging device and an electronic device may drive a fan to cool a coil included in a charging unit. An external electronic device being charged by the wireless charging device may produce heat during the charging process, and may also produce heat, based on the driving of a display. When using the wireless charging device mounted on a car, the external electronic device may use the display at maximum brightness. Consequently, the electronic device may produce a large amount of heat at a front transparent plate in which the display is located. When the heat produced in the electronic device is excessive, wireless charging efficiency of the electronic device may deteriorate.

SUMMARY

The disclosure is made to address at least the disadvantages described above and to provide at least the advantages described below.

An aspect of the disclosure is to provide an electronic device and a wireless charging device that cool a front plate to which a display, which may excessively produce heat in an external electronic device, is disposed.

Another aspect of the disclosure is to provide an electronic device and a wireless charging device that cool an external electronic device while cooling a charging unit, thereby improving the wireless charging efficiency of the external electronic device.

In accordance with an aspect of the disclosure, an electronic device is provided, which includes a main body, an intake hole formed at a first face facing a first direction in the main body, a fan disposed inside the main body and pulling air through the intake hole, a charging device disposed between the fan and a second face facing a second direction opposite to the first direction in the main body, and the charging device including a coil that supplies power to an external electronic device, a plurality of holders disposed to a side face in the main body, the plurality of holders holding the external electronic device mounted on the second face, and a holder flow path that provides the air, which is circulated by the fan to each of the plurality of holders, toward the external electronic device.

In accordance with an aspect of the disclosure, a wireless charging device is provided for a car. The wireless charging device includes a main body, an intake hole formed at a first face facing a first direction in the main body, a mounting member formed at the first face to fix the main body to an external object, a fan disposed inside the main body and pulling air through the intake hole, a plurality of holders disposed to a side face in the main body, the plurality of holders holding an external electronic device mounted to a second face facing a second direction opposite to the first direction in the main body, and a holder flow path that provides the air, which is circulated by the fan to each of the plurality of holders, toward a front face of the external electronic device.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION OF EXEMPLARY EMBODIMENTS

Figure 1:
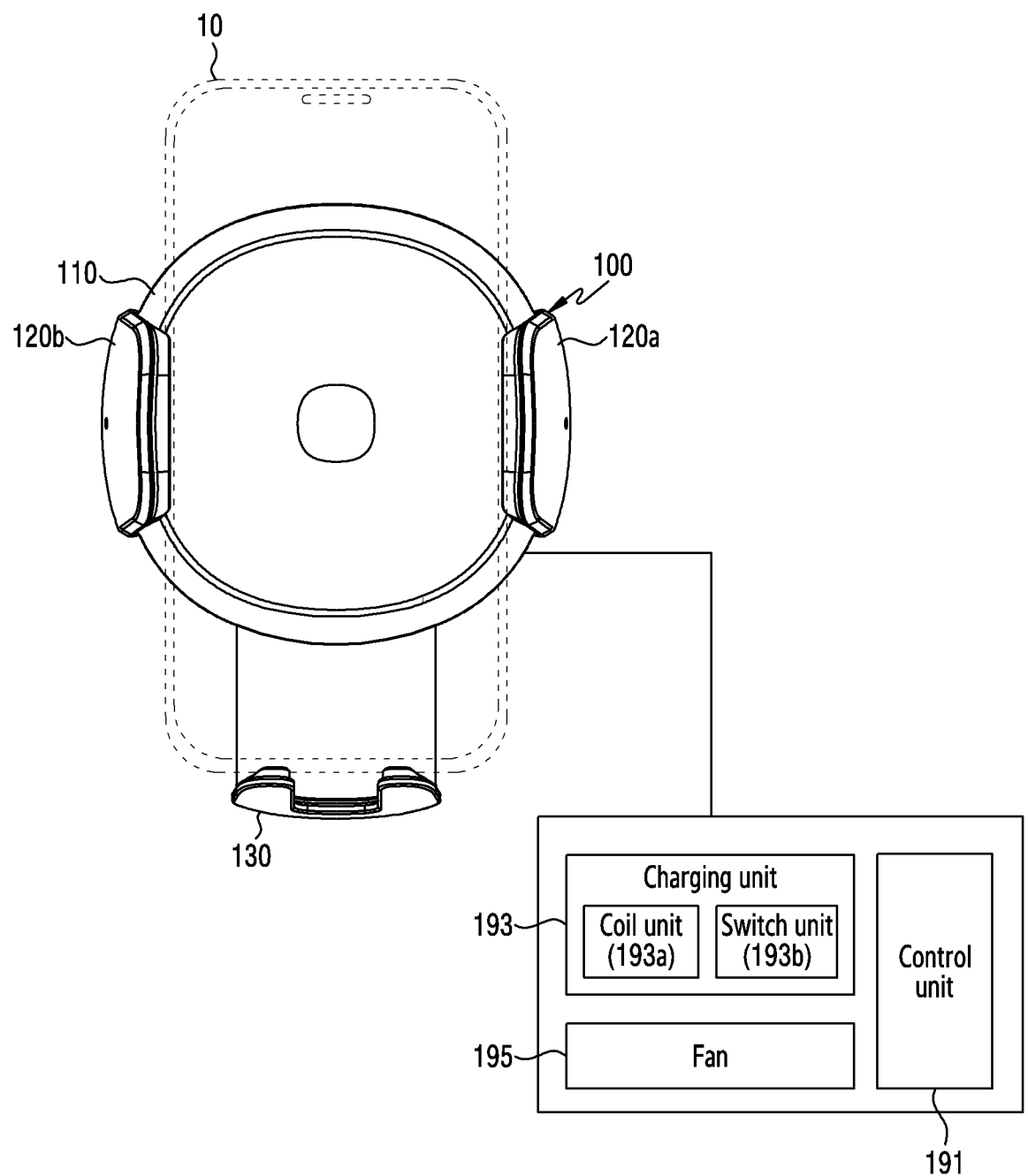
FIG. 1 illustrates a front view of an electronic device and a block diagram of the electronic device according to an embodiment.

Hereinafter, various embodiments of the disclosure will be described below with reference to the accompanying drawings. It should be appreciated that the various embodiments of the disclosure and the terms used herein are not intended to limit the technological features set forth herein to particular embodiments and include various changes, equivalents, or replacements for a corresponding embodiment.

An electronic device according to an embodiment of the disclosure includes various types of devices. The electronic device may include a home wireless charging device, a car wireless charging device, a wired charging dock, a wireless charging device included in a home electronic device, a charging device included in a mouse or keyboard pad, or a wireless charging device included in furniture or items in daily use.

An external electronic device according to an embodiment of the disclosure may include various types of electronic devices, such as a portable communication device (e.g., a smart phone), a computer device, a portable multimedia device, a portable medical device, a camera, a wearable device, or a home appliance. The electronic device and the external electronic device are not limited to the examples described above.

With regard to the description of the drawings, similar reference numerals may be used to refer to similar or related elements. A singular form of a noun corresponding to an item may include one or more of the things, unless the relevant context clearly indicates otherwise. Each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Terms such as "1st" and "2nd," or "first" and "second" may be used to simply distinguish a corresponding component from another and do not limit the components in other aspect (e.g., importance or order).

If an element (e.g., a first element) is referred to, with or without the term "operatively" or "communicatively", as "coupled with," "coupled to," "connected with," or "connected to" another element (e.g., a second element), this indicates that the element may be coupled with the other element directly (e.g., wiredly), wirelessly, or via a third element.

The term "module" may include a unit implemented in hardware, software, or firmware, and may interchangeably be used with other terms, e.g., "logic," "logic block," "part," or "circuitry". A module may be a single integral component, or a minimum unit or part thereof, adapted to perform one or more functions. A module may be implemented as an application-specific integrated circuit (ASIC).

Various embodiments as set forth herein may be implemented as software including one or more instructions that are stored in a storage medium that is readable by a machine. A processor of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., Compact Disc Read Only Memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. The integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

FIG. 1 illustrates a front view of an electronic device and a block diagram of the electronic device according to an embodiment.

Referring to FIG. 1, an electronic device (or a charging device) 100 includes a main body 110, a first holder 120a, which moves in a first direction in a side face from the main body 110, a second holder 120b, which moves in a second direction opposite to the first direction, and a support 130 which supports an external electronic device 10 mounted to the main body 110 by the first holder 120a and the second holder 120b.

The electronic device 100 may be mounted to a table, a wall, or a car. The electronic device 100 may be charged by mounting the external electronic device 10.

The main body 110 includes a mounting face at which the external electronic device 10 is mounted, a side face formed along an edge of the mounting face, and a rear face facing the mounting face. The first holder 120a and the second holder 120b may be adjusted according to a size of the external electronic device 10 by moving from the side face of the electronic device 100. The positions of the first holder 120a and second holder 120b are adjusted to fix (or hold) the external electronic device 10 to the mounting face of the main body 110. The support 130 may support the side face of the external electronic device 10 facing a direction of gravity. The electronic device 100 may be in an inclined manner. For example, when the electronic device 100 is mounted on the car, the electronic device may be inclined with respect to the ground or vertical from the ground so that a display of the external electronic device 10 is visible to a user.

The electronic device 100 includes a charging unit 193 that transfers power to the external electronic device 10, a fan 195 that circulates external air to cool the charging unit 193, and a control unit 191 that controls the charging unit 193 and the fan 195. The charging unit 193 includes a coil unit 193a and a switch unit 193b.

The coil unit 193a includes one or more coils, from which power may be supplied to the external electronic device 10 mounted to the main body 110 based on a magnetic induction scheme or a magnetic resonance scheme. The external electronic device 10 may include a reception circuit for receiving charging power based on the magnetic induction scheme or the magnetic resonance scheme. When the external electronic device 10 is mounted to the main body 110, a coil for receiving power may be formed in a region corresponding to the coil unit 193a.

The coil unit 193a may include a plurality of coils based on a power level of the charging power. The switch unit 193b may adjust amplification of the coil unit 193a. The switch unit 193b may include switches corresponding to the number of coils included in the coil unit 193a. The control unit 191 may control an operation of adjusting the switch unit 193b.

The fan 195 may reduce heat of the charging unit 193 by circulating external air to cool the charging unit 193. The fan 195 may also circulate air onto the external electronic device 10 in order to cool the external electronic device 10.

The control unit 191 may control a rotation speed of the fan 195 or may turn the fan on. For example, the control unit 191 may determine a heat level of the charging unit 193, based on a temperature reading of a sensor disposed inside the main body 110 of the electronic device 100. The control unit 191 may drive the fan if an inner temperature of the main body 110 is greater than or equal to a designated temperature, or may increase the speed of the fan, if the fan is driven. The control unit 191 may use a sensor located at a mounting face of the main body 110 to circulate the air to the external electronic device by driving the fan, in response to detecting of a surface temperature of the external electronic device 10. If the temperature of the external electronic device 10 is greater than or equal to the designated temperature, the control unit 191 may drive the fan, or may adjust the speed of the fan to adjust an amount of the air circulated to the external electronic device 10.

Figure 2:
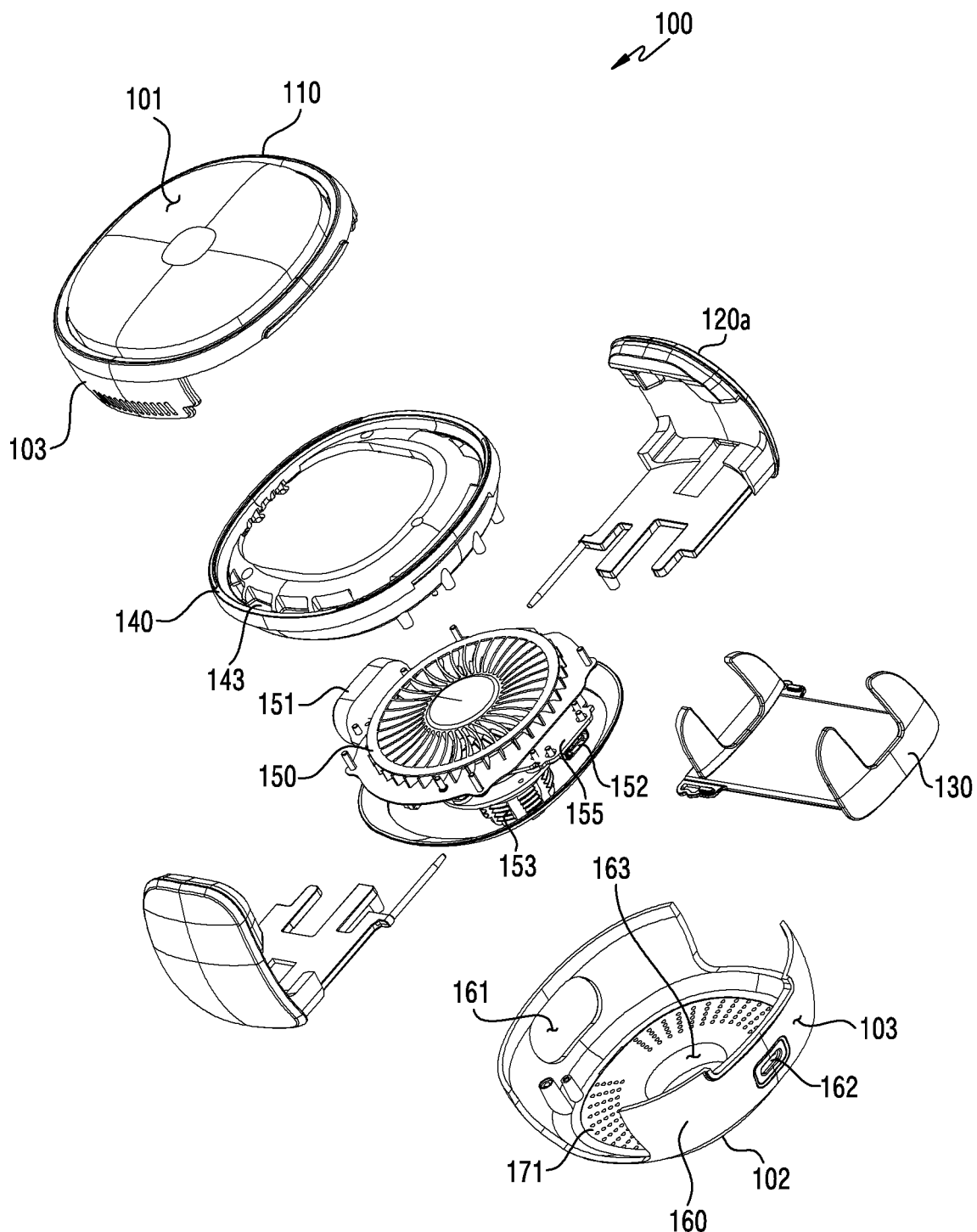
FIG. 2 illustrates an exploded view of an electronic device according to an embodiment.

FIG. 2 illustrates an exploded view of an electronic device according to an embodiment.

Referring to FIG. 2, the main body 110 includes a mounting face 101, a rear housing 160 facing the mounting face 101, a bracket (or a support member) 140, a fan 150, and holders 120a and 120b.

The mounting face 101 may be a face on which an external electronic device is mounted. The mounting face 101 may include a flexible or elastic material to reduce impact of the external electronic device, such as a silicon or rubber material.

The rear housing 160 includes a rear face 102 facing the mounting face 101. The rear face 102 includes intake holes 171 through which external air can be received. The intake holes 171 may be disposed radially to a rear face.

The rear housing 160 includes an opening 161, through which an operation button 151 protrudes, and a power connection hole 162. The opening 161 and the power connection hole 162 may be formed at a side face 103 extending from an edge of the rear housing 160. The rear face 102 includes a through-hole 163 through which a mounting member 153 protrudes. The through-hole 163 may be disposed at a center of a radial shape formed by the plurality of intake holes 171.

The mounting face 101 and the rear face 102 may be spaced apart to form an inner space. A side face of the main body 110 may extend along an edge of the mounting face 101 and rear face 102. Part of the side face 103 may be formed along part of the edge of the mounting face 101, while the rest of the side face 103 may be formed along part of the edge of the rear face 102. Alternatively, the side face 103 may extend along an edge of one of the mounting face 101 and the rear face 102.

The electronic device 100 includes a first holder 120a and a second holder 120b. The first holder 120a and the second holder 120b may be disposed to face the side face 103. The first holder 120a and the second holder 120b may be partially visible from the outside through an opening formed at the side face when the mounting face 101 and the rear housing 160 are coupled. The first holder 120a and second holder 120b may move to hold an external electronic device.

The electronic device 100 includes the bracket 140 and the fan 150 in an inner space. The bracket 140 may support the mounting face 101. A charging coil may be disposed to the bracket 140, below the mounting face 101, or inside the mounting face 101.

The fan 150 may be disposed below the bracket 140. The fan 150 may include blades that rotate by a driving unit, such as a motor, drawing in external air, and circulating the air to front and rear faces of the external electronic device disposed to the mounting face 101. The fan 150 may be coupled to a printed circuit board 155. A control unit disposed to the printed circuit board 155 may adjust the driving of the fan 150. The driving unit of the fan 150 may be an actuator or motor for rotating the fan 150. The operation button 151 may receive an input from a user to operate the electronic device 100. The operation button 151 may be electrically coupled with the printed circuit board 155 and may drive a charging unit or the fan 150 of the electronic device 100 in response to being pressed. A power connector 152 may be disposed to an edge of the printed circuit board 155. The power connector 152 may be viewed from the outside through the power connection hole 162 formed at the side face 103. Part of the power connector 152 may be partially inserted to the power connection hole 162.

The mounting member 153 may protrude from the inside of the electronic device 100 to pass through the through-hole 163. The mounting member 153 may protrude from an internal construction of the electronic device 100. The mounting member 153 may be formed of a plurality of legs. Each leg may be located at a vent of a car. Alternatively, the mounting member 153 may be fixed to a mounting cradle in the car. The mounting member 153 may be engaged with the mounting cradle using an engagement device. For example, the mounting member 153 may be bonded to the mounting cradle in a rotatable manner by being inserted to a groove formed at the mounting cradle. The mounting member 153 may be fixed to the mounting cradle through hook fastening or screw fastening.

Figure 3A:
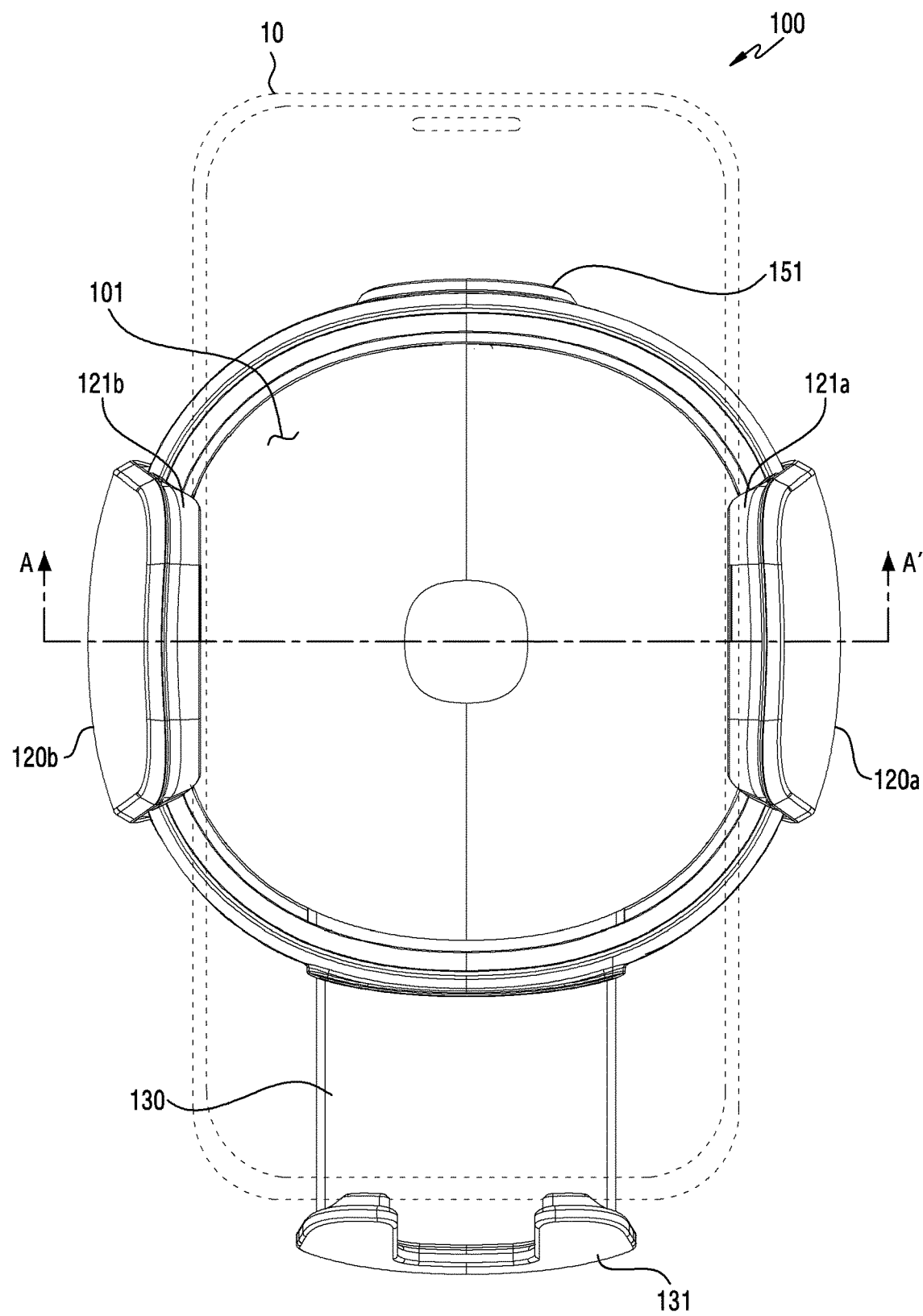
FIG. 3A illustrates a front view of an electronic device to which an external electronic device is mounted according to an embodiment.
Figure 3B:
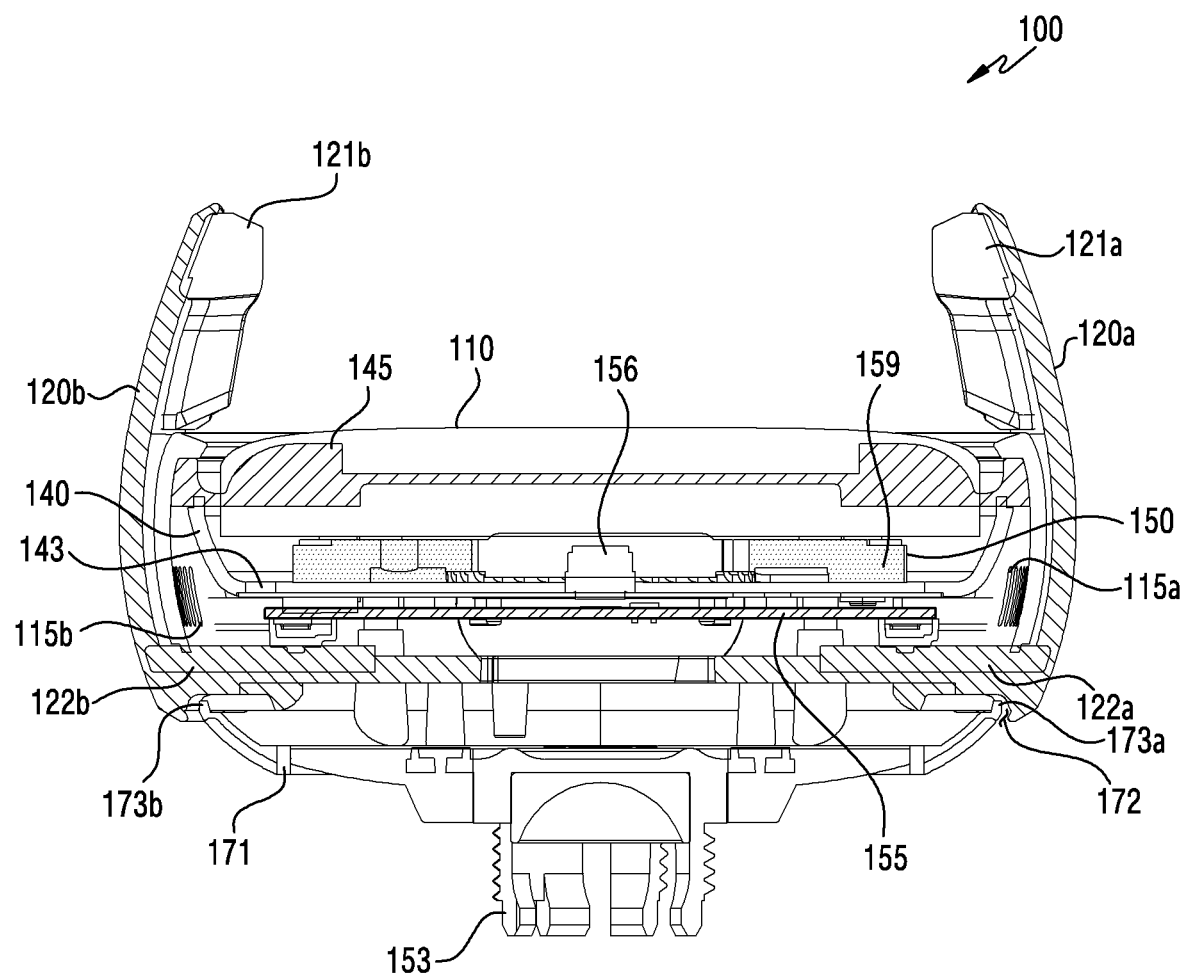
FIG. 3B illustrates a cross-sectional view of the electronic device of FIG. 3A, taken along line A-A', according to an embodiment.

FIG. 3A illustrates a front view of an electronic device to which an external electronic device is mounted according to an embodiment. FIG. 3B illustrates a cross-sectional view of the electronic device of FIG. 3A, taken along line A-A', according to an embodiment.

Referring to FIGS. 3A and 3B, the electronic device 100 includes the main body 110, the first holder 120a, and the second holder 120b.

The main body 110 includes a coil 145 formed inside the mounting face 101. The coil 145 may transfer power to an external electronic device 10 disposed to the mounting face 101 through electromagnetic induction. For example, the external electronic device may include a battery and a coil or a pattern. When current flows to the coil 145, current caused by electromagnetic induction may flow to the coil or pattern of the external electronic device 10, and charge the battery. As described above, the charging of the external electronic device 10 may produce heat, and the use of a display of the external electronic device 10 may also produce heat.

The main body 110 may form a flow path for transferring air received through the intake hole 171 to a fan through arrangement of various instruments. For example, the bracket 140 disposed inside the main body 110 may form the air path. The air may flow along a surface of the bracket 140, and the air may be transferred to the fan 150 through an air flow passage 143 formed in the bracket 140. The air flow passage 143 may be formed of a plurality of openings.

Figure 4A:
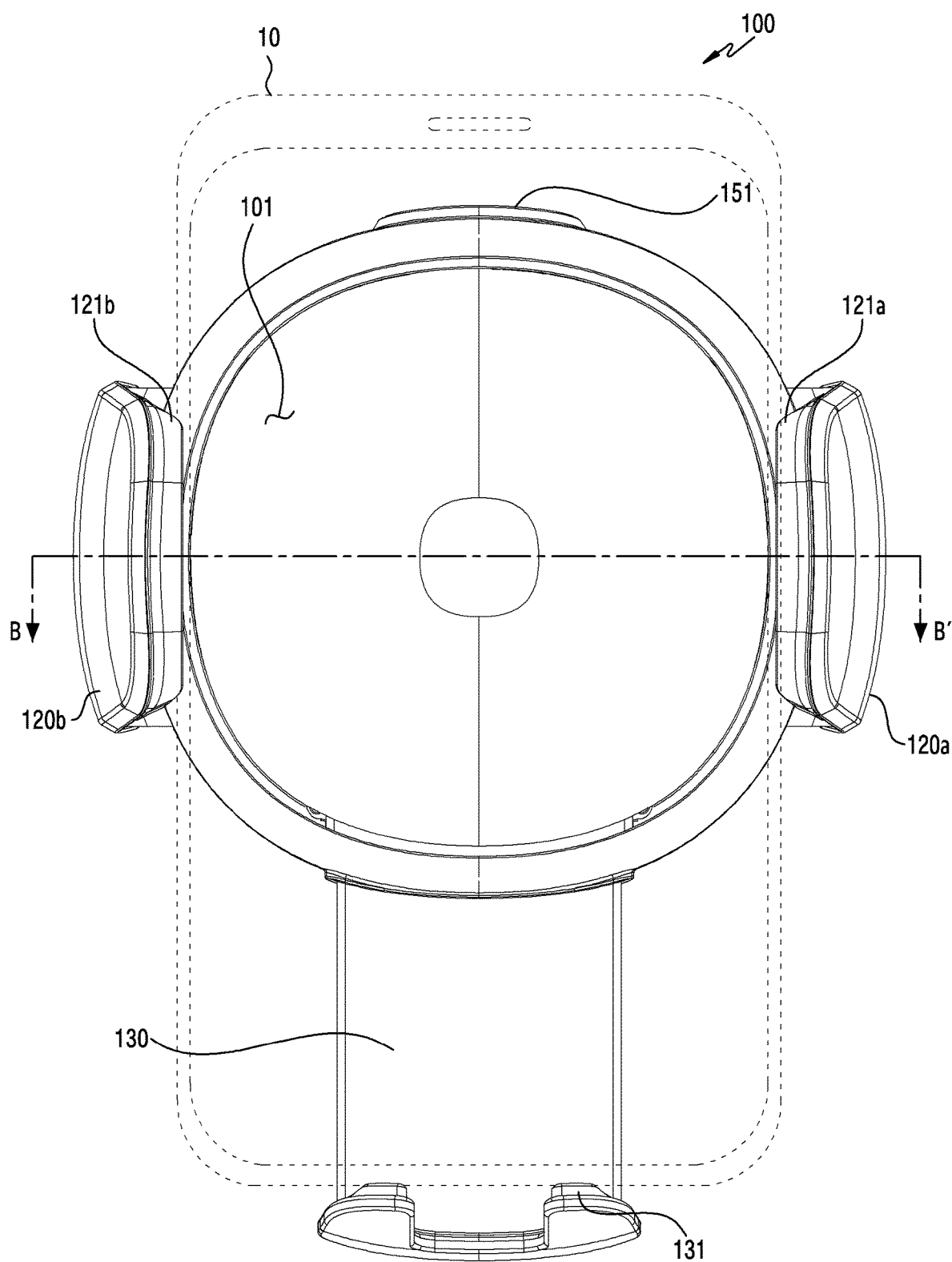
FIG. 4A illustrates a front view of an electronic device to which an external electronic device having a different size is mounted according to an embodiment.
Figure 4B:
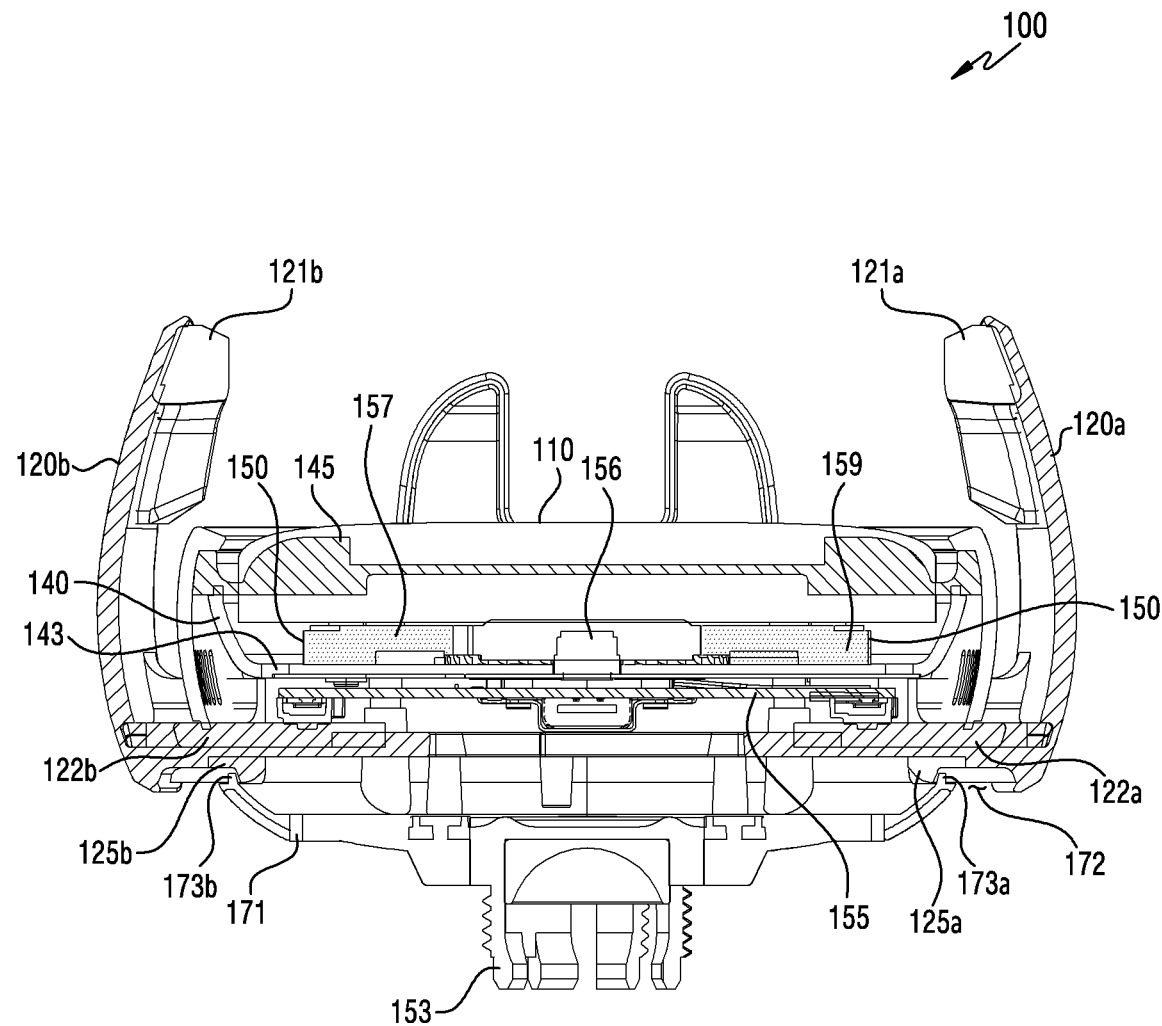
FIG. 4B illustrates a cross-sectional view of the electronic device of FIG. 4A, taken along line B-B', according to an embodiment.

As illustrated in FIG. 4B, the fan 150 includes a driving unit 156 and blades 157 and 159. The driving unit 156 rotates the blades 157 and 159. The driving unit 156 may include a motor, and may be combined with the blades 157 and 159. The plurality of blades 159 may be disposed in a spiral shape. A groove or opening that can be combined with the driving unit 156 may be included at a center of the blades 157 and 159. The printed circuit board 155 may be electrically coupled with the driving unit 156. The driving unit 156 may rotate to transfer power of the driving unit 156 to the blades 157 and 159. The blades 157 and 159 may rotate about an axis of the driving unit 156 by using transferred rotational force. The printed circuit board 155 may include a processor that controls the driver 156, based on a temperature inside the electronic device 100 or a temperature of the external electronic device 10.

The first holder 120a and the second holder 120b may be symmetrical with each other. The first holder 120a includes a first holder arm 122a and a first grip portion 121a. The first holder arm 122a may be located inside the main body 110, and may slide outward from the inside of the main body 100. The movement of the first holder arm 122a may result in a change in a location of the first grip portion 121a. The first holder arm 122a may extend from the inside of the main body 110 toward a side face 103 of the main body 110. Part of the first holder arm 122a may be viewed from the outside. The first grip portion 121a may extend from an end viewed from the outside of the first holder arm 122a in a direction in which the mounting face 101 faces outward. The first grip portion 121a may further extend with respect to the mounting face 101.

The second holder 120b includes a second holder arm 122b and a second grip portion 121b. The second holder arm 122b may be located inside the main body, and may slide outward from the inside of the main body 110. The second holder arm 122b may move in a direction opposite to a movement direction of the first holder arm 122a. The second holder arm 122b may move substantially by the same distance as a movement distance of the first holder arm 122a. The movement of the second holder arm 122a may result in a change in a location of the second grip portion 122b. The second grip portion 122b may move in a direction opposite to a direction of the first grip portion 122a, and the external electronic device 10 may be disposed to a space between the first group portion 122a and the second grip portion 122b. The second holder arm 122b may extend from the inside of the main body 110 toward the side face 103 of the main body 110, and may extend in a direction opposite to a direction in which the first holder arm 122a extends. Part of the second holder arm 122b may be viewed from the outside. The second grip portion 121b may extend from an end viewed from the outside of the second holder arm 122b in a direction in which the mounting face 101 faces outward. The second grip portion 121b may further extend with respect to the mounting face 101.

The first grip portion 121a or the second grip portion 121b may be formed of a soft material, and deformation may occur when the external electronic device is gripped. The first grip portion 121a or second grip portion 121b formed of the flexible material may prevent damage in a region of the external electronic device which is in contact with the first grip portion 121a or the second grip portion 121b.

The main body 110 may receive air through an intake slit 172 formed between the main body 110 and the first grip portion 121a or the second grip portion 121b in addition to the intake hole 171. Part of the air received by the main body through the fan 150 may be transferred to the first grip portion 121a and the second grip portion 121b through a first side outlet 115a and second side outlet 115b formed at the side face of the main body 110. The first grip portion 121a may transfer the air transferred through the first side outlet 115a toward the external electronic device 10. The air may be transferred to the external electronic device 10 along a surface facing the side face of the main boy 110. The second grip portion 121b may transfer the air transferred through the first side outlet 115b toward the external electronic device 10. The air may be transferred to the external electronic device 10 along a surface facing the side face of the main body 110 of the second grip portion 121b.

The mounting member 153 may protrude from a rear face of the main body 110, and the electronic device 100 may be mounted to a vent of a car or a mounting cradle of the car through the mounting member 153.

The main body 110 includes a first stopper 173a and a second stopper 173b. The first stopper 173a and the second stopper 173b may form part of the side face of the main body 110. The first stopper 173a may adjust a distance by which the first holder 120a slides outward, and the second stopper 173b may adjust a distance by which the second holder 120b slides outward. The first stopper 173a may be formed at a side face of the main body 110 to which the first holder 120a is disposed, and the second stopper 173b may be formed at a side face of the main body 110 to which the second holder 120b is disposed. The first stopper 173a and the second stopper 173b may protrude toward the mounting face 101 from the part of the side face of the main body 110 to restrict the movement of the first holder 120a and the second holder 120b.

FIG. 4A illustrates a front view of an electronic device to which an external electronic device having a different size is mounted according to an embodiment. FIG. 4B illustrates a cross-sectional view of the electronic device of FIG. 4A, taken along line B-B', according to various embodiments.

Referring to FIGS. 4A and 4B, the external electronic device 10 may be an electronic device having a wider width, compared to FIGS. 3A and 3B.

The first holder 120a and the second holder 120b may move from the side face of the main body 110 to the outside to mount the external electronic device 10. The first holder 120a and the second holder 120b may be coupled to an elastic member at an end thereof to fix the external electronic device 10. The elastic member may pull the first holder 120a and the second holder 120b into the electronic device 100. When the external electronic device 10 is mounted to the mounting face 101, the first holder 120a and the second holder 120b may press and fix the side face of the external electronic device 10. The first holder 120a and the second holder 120b may slide outward from the side face of the electronic device 100, and may move by the width of the external electronic device 10.

The first holder 120a and the second holder 120b include a first protrusion 125a and second protrusion 125b protruding in a rear direction of the main body 110. The first protrusion 125a may have a distance limit when moving to the outside due to the first stopper 173a formed in the main body. The second protrusion 125b may have a distance limit when moving to the outside due to the second stopper 173b formed in the main body.

Comparing FIG. 3A to FIG. 4A, the external electronic device 10 of FIG. 3A may have a narrower width than the external electronic device 10 of FIG. 4A.

A length by which the first holder 120a and the second holder 120b move to the side face of the main body 110 may vary depending on the width of the external electronic device 10. When the external electronic device 10 having a narrow width is mounted, as illustrated in FIG. 3A, the external electronic device 10 can be fixed even if the first holder 120a and the second holder 120b move by a short distance from the main body. When the external electronic device 10 having a wide width is mounted, as illustrated in FIG. 4A, the first holder 120a and the second holder 120b may move by a long distance from the side face of the main body to fix the external electronic device 10.

An elastic member may be disposed at an end of the first holder 120a or the second holder 120b. The elastic member may apply force for holding the external electronic device 10 through the first holder 120a or the second holder 120b.

Figure 5:
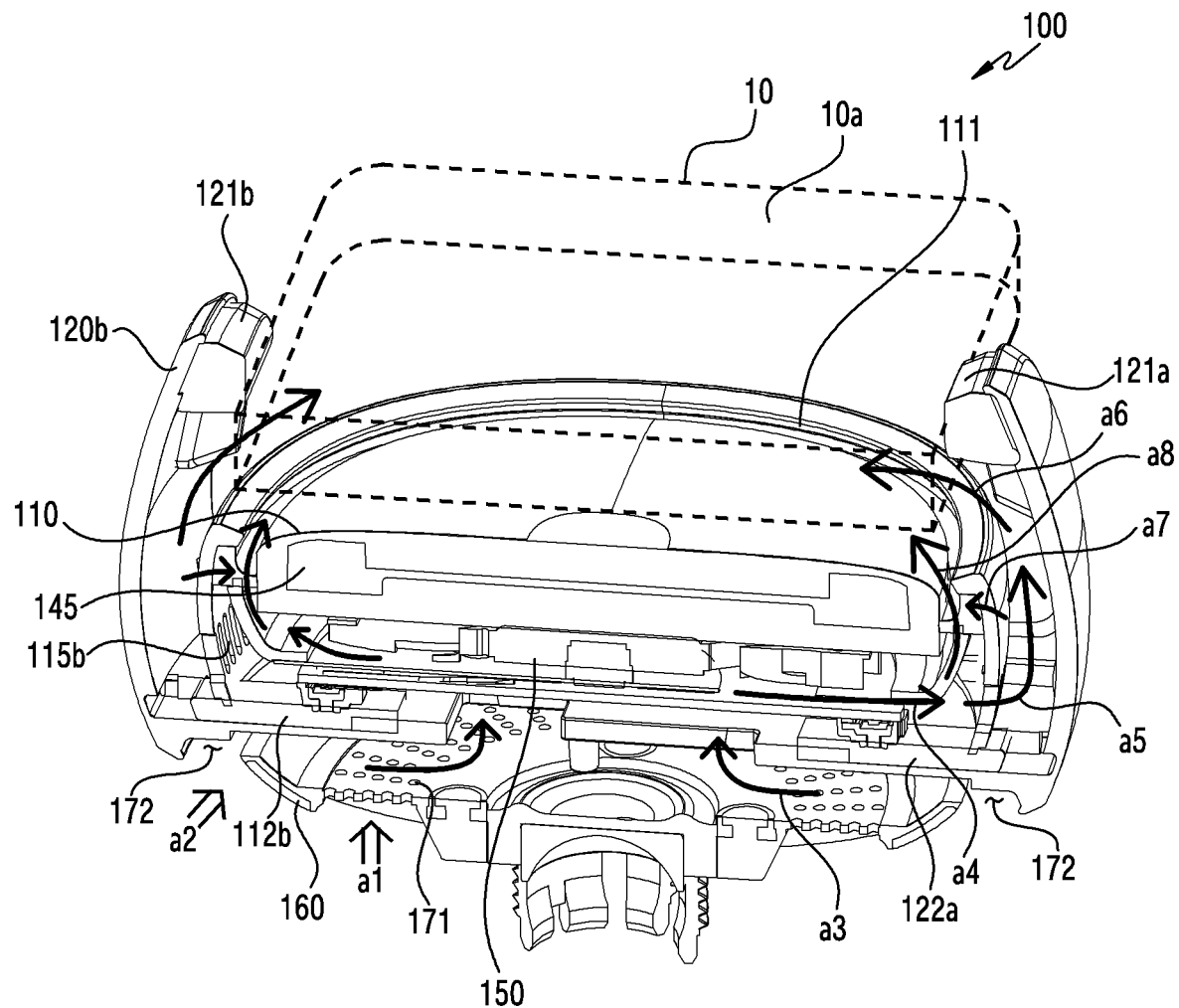
FIG. 5 illustrates air flow inside an electronic device according to an embodiment.

FIG. 5 illustrates air flow inside an electronic device according to an embodiment.

Referring to FIG. 5, the fan 150 pulls external air into the electronic device 100, and circulates the air to the outside of the electronic device 100. The rear housing 160 of the main body 110 of the electronic device 100 includes the intake holes 171, which are coupled with a flow path inside the main body 110 by passing through the rear housing 160. The flow path inside the main body 110 may be formed by a housing constituting the main body 110 or an internal construction, and may transfer air to the fan 150. The air transferred to the fan 150 may be transferred to the rear face of the external electronic device 10 through a vent 11 formed at the mounting face 101. The air transferred to the fan 150 may be transferred to the rear face of the external electronic device 10 through the vent 111 formed at the mounting face 101, and part of the air may be transferred to the front face of the external electronic device 10 along the side face of the first holder 120a and second holder 120b or a flow path formed at the side face.

The air may be introduced into the electronic device 100 through the intake slit 172 formed between the rear housing 160 and the first holder 120a or the second holder 120b. The air introduced through the intake slit 172 may move along the same path as the air introduced through the intake hole 171. For example, the flow path inside the main body 110 may include a passage through which the air introduced from the intake hole 171 and intake slit 172 can move in common.

The external electronic device 10 may be disposed to the mounting face of the main body 110, and may be fixed by the first holder 120a and the second holder 120b. The first holder 120a includes the first holder arm 122a and the first grip portion 121a. The first holder arm 122a may extend from the inside of the main body 110 toward the side face of the main body 110 and may be viewed from the outside. The first grip portion 121a may extend from an end viewed from the outside of the first holder arm 122a toward the mounting face in a direction perpendicular to the mounting face. The first grip portion 121a may extend along the side face of the main body 110, and may be formed to correspond to a shape of the side face of the main body 110. The first grip portion 121a may extend to be higher than a height at which the mounting face is located to hold the external electronic device 10 at the mounting face. An end of the first grip portion 121a may include a protrusion to hold the external electronic device 10. The protrusion may be formed of an elastic member to prevent damage of the external electronic device.

The second holder 120b includes the second holder arm 122b and the second grip portion 121b. The second holder arm 122b extends from the inside of the main body 110 toward the side face of the main body 110 and may be viewed from the outside. The second grip portion 121b may extend from an end viewed from the outside of the second holder arm 122b toward the mounting face in a direction perpendicular to the mounting face. The second grip portion 121b may extend along the side face of the main body 110, and may be formed to correspond to a shape of the side face of the main body 110. The second grip portion 121b may extend to be higher than a height at which the mounting face is located to hold the external electronic device 10 at the mounting face. An end of the second grip portion 121b may include a protrusion to hold the external electronic device 10. The protrusion may be formed of an elastic member to prevent damage of the external electronic device.

The external electronic device 10 may be held in place by the first holder 120a and the second holder 120b by being mounted to the mounting face of the main body 110. The electronic device 100 may detect the mounting of the external electronic device 10 or may start charging in response to an external input. The mounting may be detected by identifying an exchange of an electromagnetic signal between the coil 145 of the electronic device 100 and a coil disposed inside the external electronic device 10, and the electronic device 100 may transfer power to the coil disposed inside the external electronic device 10 from the coil 145 in response to detecting of the mounting. As another example, after mounting the external electronic device 10, the electronic device 100 may detect an external input such as a click, touch, etc., of a physical key disposed to the main body 110. Upon detecting the external input, the electronic device 100 may allow current to flow to the coil 145, and the coil 145 may transfer power through an electromagnetic operation with the coil disposed to the external electronic device 10.

When the external electronic device 10 supports a quick charging mode, the electronic device 100 may charge the external electronic device 10 in the quick charging mode. The electronic device 100 may charge the external electronic device 100 in a normal charging mode.

The electronic device 100 may perform charging in a charging mode supported by the external electronic device 10. For example, the electronic device 100 may receive a signal regarding the charging mode from the external electronic device 10, and may determine the charging mode in response to the received signal. If the signal transferred from the external electronic device is a normal charging signal, the electronic device 100 may transfer current corresponding to the normal charging mode to the coil 145. If the signal transferred from the external electronic device 10 is a quick charging signal, the electronic device 100 may transfer current corresponding to the quick charging mode to the coil 145.

When the electronic device 100 charges the external electronic device 10, the temperatures of the electronic device 100 and the external electronic device 10 may increase. For example, the coil 145 of the electronic device 100 may produce heat, and the external electronic device 10 may produce heat in a power receiving operation.

The electronic device 100 may be a wireless charging device for a car. When the external electronic device 10 is used for navigation in the car, a display of the external electronic device 10 may be activated at the same time the wireless charging is being performed. The display of the external electronic device 10 may form a first face 10a of the external electronic device 10 (e.g., a front face of the external electronic device 10). The external electronic device 10 may produce heat in a rear face of the external electronic device 10 (or a face in contact with a mounting face). Additionally, since the display is persistently activated, the external electronic device 10 may also produce heat in the first face 10a.

Air inside the electronic device 100 may be transferred to a front face or rear face of the external electronic device 10. The electronic device 100 may drive the fan 150 when a temperature inside the electronic device 100 or a temperature of the external electronic device 10 increases due to a charging operation. The temperature inside the electronic device 100 may be obtained through a temperature sensor disposed adjacent to the coil 145, or may be obtained through a temperature sensor disposed in an inner space of the electronic device 100. A temperature outside the electronic device 100 may be obtained through a temperature sensor disposed to the mounting face of the electronic device 100. The electronic device 100 may receive temperature information obtained from the external electronic device 10. The electronic device 100 may drive the fan 150 when the temperature of the external electronic device 10 or the temperature inside the electronic device 100 is higher than a designated temperature.

The electronic device 100 may take in external air, based on the driving of the fan 150. When the fan 150 is driven, pressure inside the main body 110 may decrease, and the external air may be introduced into the main body 110 of which pressure decreases. When the fan 150 rotates, the air inside the electronic device 100 may be released to the outside through the vent 111, the first outlet 115a, or the second outlet 115b, and a pressure drop may occur inside the electronic device 100 due to the released air. The external air may be taken in through the intake hole 171 formed in the rear housing 160 of the electronic device 100 and the intake slit 172 formed between the rear housing 160 and the first holder 120a and the second holder 120b. External air a1 may be introduced into the electronic device 100 through the intake hole 171. External air a2 may be introduced into the electronic device 100 through the intake slit 172 which is a separated space between the rear housing 160 and the first holder 120a and the second holder 120b. The external air a1 and the external air a2 may be introduced into the electronic device 100 and combined with each other through a flow path formed in the main body 110.

The external air a1 and a2 may be introduced into the main body 110 of the electronic device 100 and thus may be transferred to a flow path formed below the fan 150. The flow path formed below the fan 150 may be coupled with a space formed at a center of the fan 150. Air a3 may be transferred to the fan 150 through the flow path formed inside the main body. The fan 150 may transfer to an edge of the fan 150 the air a3 transferred to the center of the fan 150. Air a4 transferred to the edge of the fan 150 may be diverged in various ways depending on a shape of the flow path formed inside the main body. Due to the formed flow path or a shape of a mechanical construction disposed to the main body 110, part of the air a4 transferred to the edge of the fan 150 may travel to the side face, and the rest of it may travel to the mounting face. Air a5 transferred from the edge of the fan 150 to the side face may be transferred to the first holder 120a or the second holder 120b through the first side outlet 115a or second side outlet 115b formed at the side face. The first holder 120a or the second holder 120b may be transferred along the side face through a holder flow path formed at the side face.

Part of the air transferred to the side face of the first holder 120a or the second holder 120b may be transferred to the first face 10a of the external electronic device 10 along the side face of the first holder 120a or the second holder 120b. The rest of the air transferred to the side face of the first holder 120a or the second holder 120b may be transferred between the external electronic device 10 and the mounting face.

Air a8, which is part of the air a4 transferred to the edge, may be transferred to the rear face of the electronic device 100 through the vent 111 formed at the mounting face of the electronic device 100.

The air a8 may be transferred between the external electronic device 10 and the mounting face of the electronic device 100 to cool the rear face of the external electronic device 10. Air a6 transferred along the sides of the first holder 120a and the second holder 120b may be transferred to the first face 10a of the external electronic device 10 to cool a display of the external electronic device 10. The first holder 120a and the second holder 120b may include a holder flow path formed at a side face of the holder. Air a5 may be transferred to the first face of the external electronic device 10 through a holder flow path formed at the first holder 120a and the second holder 120b.

The air a8 may cool heat produced by wireless charging of the external electronic device 10, and the air a6 may cool heat produced by activation of the display of the external electronic device 10. Air released from the fan 150 may cool the air inside the electronic device 100.

The inside of the electronic device 100 may be cooled by circuiting the air into and out of the inside.

Figure 6:
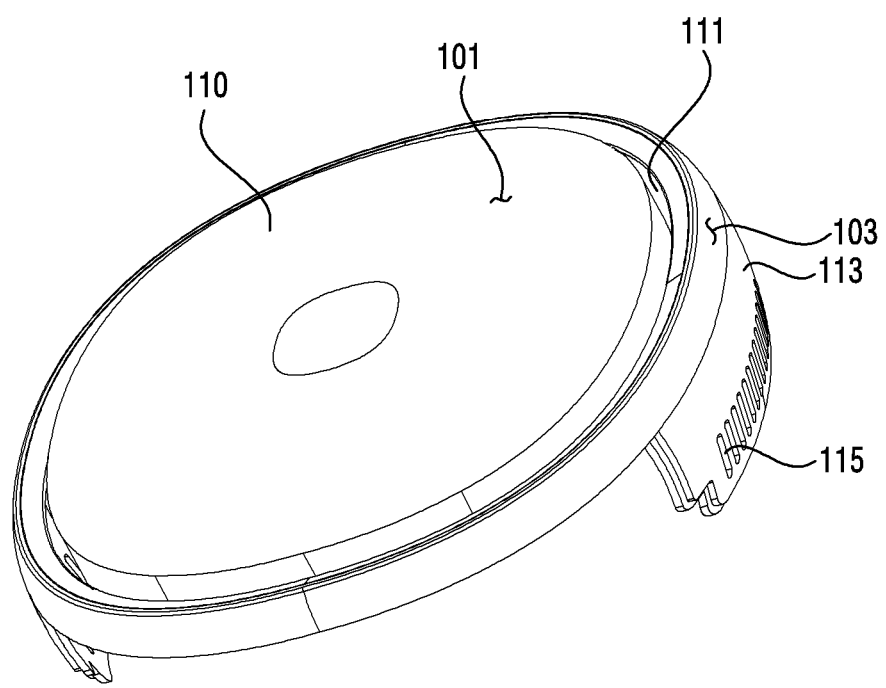
FIG. 6 illustrates a mounting face of an electronic device according to an embodiment.

FIG. 6 illustrates a mounting face of an electronic device according to an embodiment.

Referring to FIG. 6, the main body 110 includes the mounting face 101 and the side face 103. The mounting face 101 may form part of a surface of an electronic device. The mounting face 101 is a face to which an external electronic device is mounted. A coil may be disposed below the mounting face 101, or a coil may be included in a pad constituting the mounting face 101. Part of the side face 103 may be formed by extending from part of the mounting face 101 in a direction substantially perpendicular to the mounting face 101. For example, the first side face 113 extending from the part of the mounting face 101 may extend toward a rear housing. The first side face 113 may include a side outlet 115. The side outlet 115 may be formed at a side face on which a holder, e.g., the first holder 120a or the second holder 120b, is disposed. Air passing through the side outlet 115 may be transferred to the holder. The transferred air may be transferred to an external electronic device located at the mounting face 101 along a holder flow path of the holder.

Figure 7:
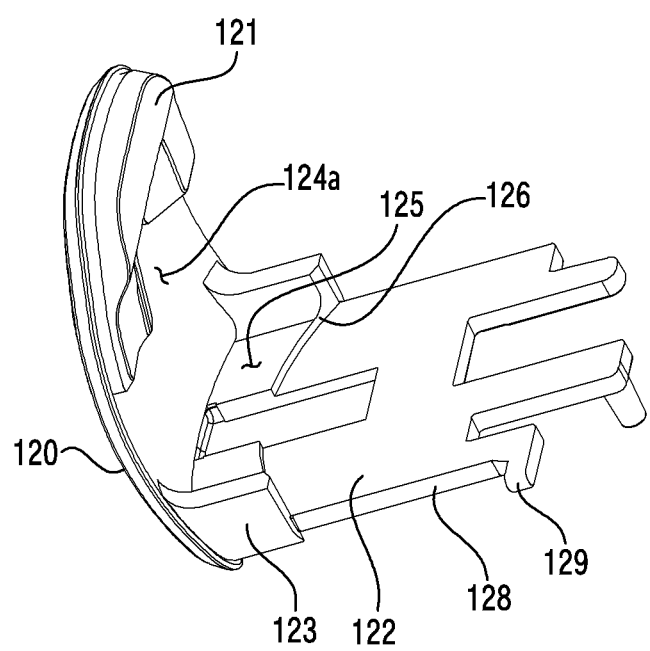
FIG. 7 illustrates a holder of an electronic device according to an embodiment.

FIG. 7 illustrates a holder of an electronic device according to an embodiment.

Referring to FIG. 7, a holder 120 includes a holder arm 122 and a grip portion 121 extending from an end of the holder arm 122 in a vertical direction.

The holder 120 includes holder flow paths 124a and 125. The first holder flow path 124a is formed at part of the grip portion 121 and the second holder flow path 125 is formed at the holder arm 122.

The first holder flow path 124a may be formed at a face facing a main body in the grip portion 121. The first holder flow path 124a may be formed along a face of the grip portion 121, and may be formed as a curved face. A surface of the first holder flow path 124a may be formed to have a curvature corresponding to the curved face of the side face of the main body. The first holder flow path 124a may transfer air transferred to the first holder flow path 124a through a side outlet of the main body to the front face or rear face of the external electronic device gripped by the grip portion 121.

Air may be transferred through a space between the holder 120 and the side face of the main body. The second holder flow path 125 may be open in a direction facing the grip portion 121 at an end of the holder arm 122. Air transferred through the second holder flow path 125 may be transferred to an external electronic device by moving to the first holder flow path 124a.

The second holder flow path 125 includes a side wall 123 extending from the side face of the main body. The side wall 123 may guide the air transferred from the side face of the main body to the first holder flow path 124a. The second holder flow path 125 includes a stepped portion 126 having a height different from that of the holder arm 122. The holder 120 and the side face of the main body may ensure a minimum separation distance due to the stepped portion 126.

The air transferred to a space formed by separating the holder 120 and the side face of the main body may be sequentially transferred to the second holder flow path 125 and the first holder flow path 124a to cool the external electronic device.

The holder arm 122 includes a guide groove 128 and a stopper 129. The guide groove 128 may be disposed between the side wall 123 of the holder 120 and the stopper 129. The guide groove 128 may be formed by being indented from an edge of the holder arm 122. The guide groove 128 may move along an opening formed at the side face of the main body to move the holder 120 to the side face of the main body. When the electronic device is not used, the holder 120 may be disposed adjacent to the side face of the main body. The guide groove 128 may be disposed inside the main body to be invisible from the outside, and may fill a space between the holder 120 and the main body. The holder 120 may fill the space between the holder 120 and the main body to prevent foreign matter from being introduced into the electronic device.

A location of the stopper 129 may be determined depending on a maximum distance by which the holder 120 moves to protrude to the outside. When the holder 120 moves to the side face of the main body, the stopper 129 is in contact with an edge of an opening formed at the side face, thereby preventing the holder 120 from moving to the outside and preventing the holder 120 from being separated by moving to the outside of the main body. The stopper 129 may protrude from part of the edge of the holder arm 122, and may protrude in a direction in which it can be caught at the opening formed at the side face of the main body.

Figure 8:
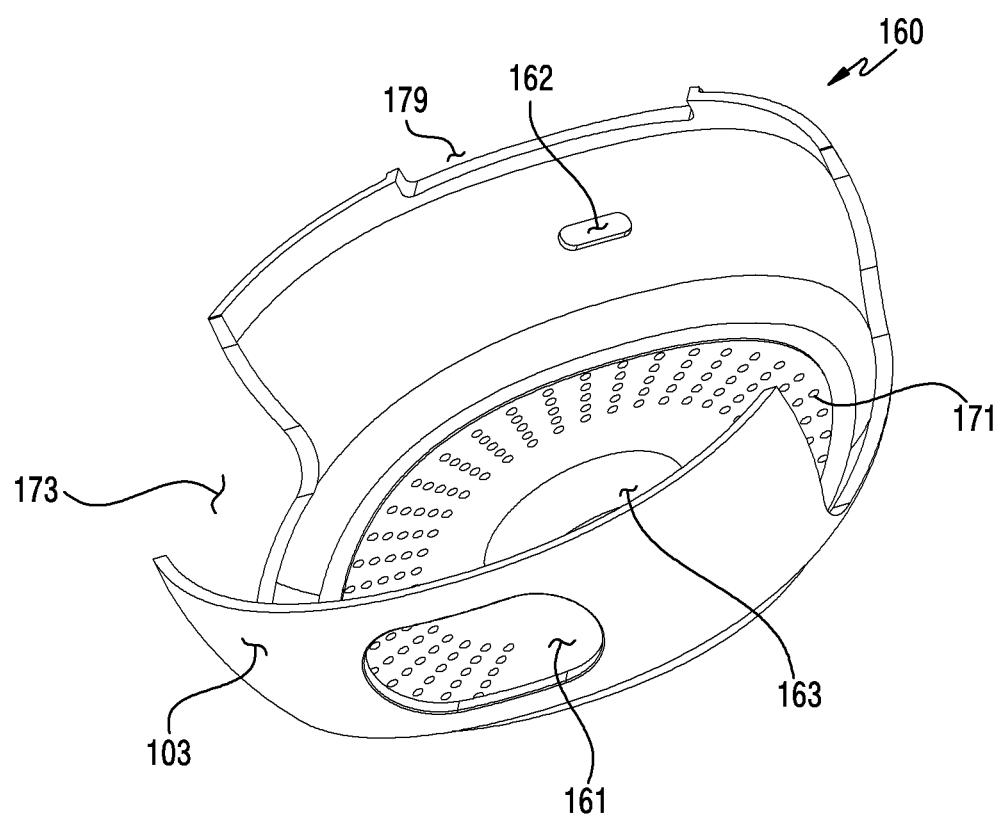
FIG. 8 illustrates a housing part of an electronic device according to an embodiment.

FIG. 8 illustrates a housing part of an electronic device according to an embodiment.

Referring to FIG. 8, a rear housing 160 includes intake holes 171 and a plurality of openings 161, 162, and 163 through which an externally visible portion of components of the electronic device disposed inside the main body can pass. The rear housing 160 may form a rear face of the electronic device and part of the side face 103.

The intake holes 171 may be disposed to the rear face of the electronic device. The intake holes 171 may include a plurality of openings, and the plurality of intake holes 171 may be disposed radially from a center of the rear face. The arrangement of the intake holes 171 is not limited thereto, and may be disposed in a spiral form or in a concentric form.

The rear housing 160 includes a plurality of grooves 173 and 179, which are passages through which a holder or support exposed to the outside of the main body moves. A part of the first side face extending from the mounting face may be disposed to the holder groove 173 constituting the passage through which the holder moves. The first side and the holder groove 173 may be spaced apart to form an opening, and the holder may move through the opening.

The holder groove 173 may be formed of two grooves, and each of the holder grooves 173 may be disposed to face each other. The plurality of holders disposed to the respective holder grooves 173 may face each other. A first holder and a second holder may face each other to grip an external electronic device.

The groove 179 of the support, which forms a passage through which the support moves, may form an opening together with the mounting face. The support may move through the opening.

The plurality of openings 161, 162, and 163 may include the power connection hole 162 through which a power connector is exposed, the through-hole 163 through which a mounting member is exposed, and the opening 161 through which an operation button is exposed. As another example, the operation button 151 may be a status indicator, etc., which may be exposed through the opening 161.

Figure 9:
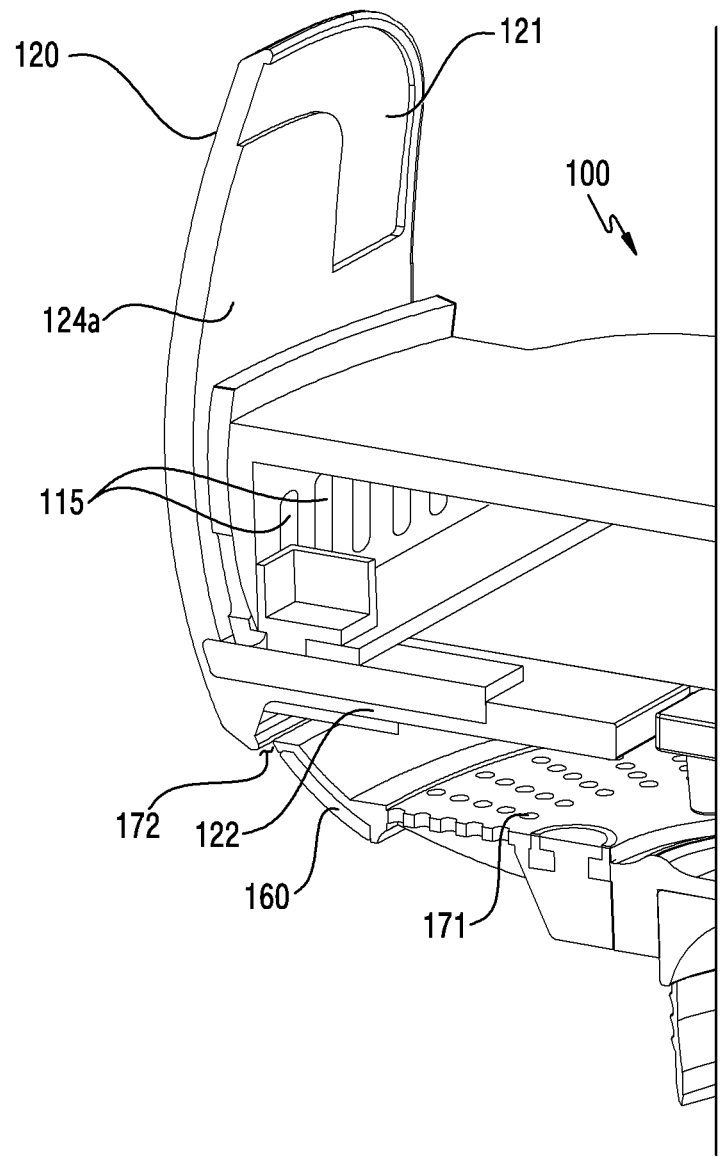
FIG. 9 illustrates a cross-sectional view of a first state of an electronic device according to an embodiment.

FIG. 9 illustrates a cross-sectional view of a first state of an electronic device according to an embodiment.

Referring to FIG. 9, an electronic device 100 is in a state in which a charging operation of the electronic device 100 is inactive, i.e., an external charging device is not mounted. A holder 120 is disposed adjacent to a side face of the electronic device 100. A face at which a holder flow path 124a of the holder 120 is formed may be disposed adjacent to a side outlet 115 of the electronic device 100. The side outlet 115 of the holder 120 may be disposed adjacent to each other, so that the holder 120 blocks the side outlet 115. The holder 120 may prevent foreign matter from being introduced through the side outlet 115, while the charging operation is inactive.

The holder 120 and the rear housing 160 may be disposed adjacent to each other. Thus, the intake slit 172 may not be present, or a fine slit may be included. The holder 120 may prevent foreign matter from being introduced through the intake slit 172, while the charging operation of the electronic device 100 is inactive.

Although FIG. 9 illustrates the intake hole 171 as being open, a plate for blocking an opening may be included inside the main body when the electronic device 100 is inactive. For example, a plate including the opening corresponding to the intake hole 171 may be disposed to the rear face of the rear housing 160 (e.g., a face on which the intake hole is disposed). The opening formed at the plate may coincide with the intake hole 171 when the electronic device operates. Locations of the intake hole 171 and the opening formed at the plate may not coincide when the electronic device does not operate or when a charging operation is inactive. When the electronic device does not operate, the intake hole 171 may not be open by a plate at which an opening is located.

The plate may close the intake hole 171 to prevent foreign matter from being introduced.

Figure 10:
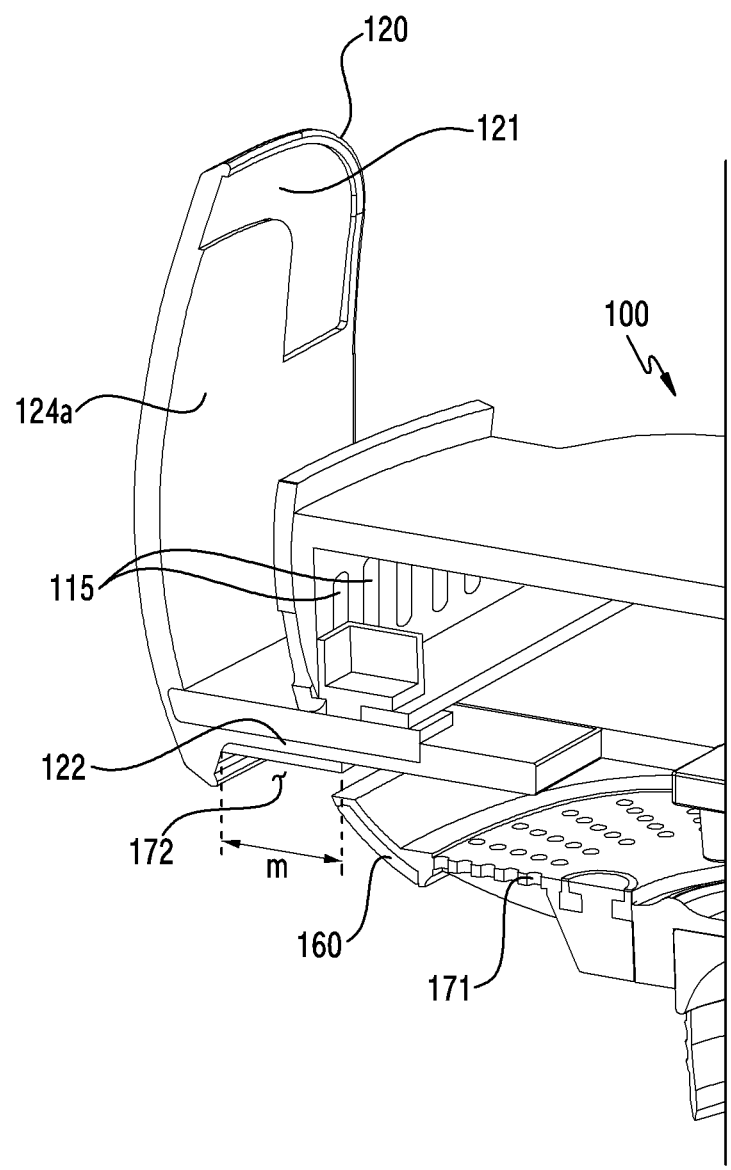
FIG. 10 illustrates a cross-sectional view of a second state of an electronic device according to an embodiment.

FIG. 10 illustrates a cross-sectional view of a second state of an electronic device according to an embodiment.

Referring to FIG. 10, unlike in FIG. 9, the electronic device 100 grips an external electronic device 10 using the holder 120, and the gripped external electronic device 10 is mounted to a mounting face of the electronic device 100.

The electronic device 100 may be in a state in which the charging operation of the electronic device 100 is active. The holder 120 may be spaced apart from the side face of the electronic device 100. For example, a face at which the holder flow path 124a of the holder 120 is formed may be spaced apart from the side outlet 115 of the electronic device 100. The charging operation of the electronic device 100 may be activated, so that the fan of the electronic device 100 is activated when a temperature inside the electronic device 100 increases or a temperature of the external electronic device increases. When the fan of the electronic device 100 is activated, external air may be introduced into the electronic device 100, and the fan may release the air to the side outlet 115 of the electronic device 100. The holder 120 and the side outlet 115 may be spaced apart from each other, so that the electronic device 100 has a space through which air can be transferred from the side outlet 115. The holder 120 may transfer the air introduced from the side outlet 115 to the external electronic device along the side face or flow path 124a of the holder 120.

The holder 120 and the rear housing 160 may be spaced apart from each other, so that the intake slit 172 is spaced apart by a distance m. The distance m may vary depending on a width of the external electronic device. While the charging operation of the electronic device 100 is active, the fan of the electronic device 100 may supply air to the electronic device 100 through the intake slit 172, and the supplied external air may be used to cool a coil by using the fan of the electronic device 100 or to cool the external electronic device.

When the charging operation of the electronic device 100 is activated, the external air may be received through the intake hole 171 and the intake slit 172 by driving the fan. The received air may be circulated by the fan disposed on an inner flow path, and the circulated air may be transferred to the holder flow path 124a of the holder 120 through the side outlet 115. The holder flow path 124a may transfer the air to a surface of the external electronic device. The air transferred to the external electronic device may cool a display of a rear face or front face of the external electronic device.

According to an embodiment, an electronic device may include a main body, an intake hole formed at a first face facing a first direction in the main body, a fan disposed inside the main body and cooling air introduced through the intake hole, a charging unit disposed between the fan and a second face facing a second direction opposite to the first direction in the main body, and including a coil supplying power to an external electronic device, a plurality of holders disposed to a side face in the main body to mount the external electronic device on the second face, and a holder flow path releasing air, which is transferred from the fan to each of the plurality of holders, toward the external electronic device.

The plurality of holders may be slidable to the outside of the electronic device.

The holder may include a holder arm extending toward the side face from the inside of the main body so as to be viewed from the outside, and a grip portion extending in the second direction from an end viewed from the outside of the holder arm.

The holder flow path may release the air to a front face of the external electronic device.

The holder flow path may be formed at the grip portion, and guides air, which is transferred by a side wall formed at a contact point of the holder arm and the grip potion, in the second direction.

The grip portion may be formed of a curved face having an inclination in a direction in which the second face is located.

In the grip portion, a face facing the main body may include a groove which guides the air transferred through the holder flow path.

The holder may be slidable through an opening formed at a side face of the main body, and the main body may include an intake slit formed at the holder and the side face of the main body.

The second face of the main body may include a side vent through which the air transferred from the fan passes.

The vent may be formed along an edge of the second face.

The vent may be formed of at least one opening. The air passing through the opening may be transferred to a rear face of the external electronic device.

The main body may have a main body flow path formed to guide air introduced into the main body to the holder flow path.

The fan may be disposed to part of the main body flow path.

The charging unit may be switched to a quick charging mode or a normal charging mode.

According to an embodiment, a wireless charging device for a car may include a main body, an intake hole formed at a first face facing a first direction in the main body, a mounting member formed at the first face to fix the main body to an external object, a fan disposed inside the main body and cooling air introduced through the intake hole, a plurality of holders disposed to a side face in the main body to fixedly mount an external electronic device to a second face facing a second direction opposite to the first direction in the main body, and a holder flow path releasing air, which is transferred from the fan to each of the plurality of holders, toward a front face of the external electronic device.

The holder may include a holder arm extending toward the side face from the inside of the main body so as to be viewed from the outside, and a grip portion extending in the second direction opposite to the first direction from an end viewed from the outside of the holder arm.

The holder flow path may be formed at the grip portion, and guides air, which is transferred by a side wall formed at a contact point of the holder arm and the grip potion, in the second direction, and may release the air to the front face of the external electronic device mounted to the second face.

The grip portion may be formed of a curved face having an inclination in a direction in which the second face is located.

In the grip portion, a face facing the main body may include a groove which guides the air transferred through the holder flow path.

The charging device may further include a charging unit disposed between the second face and the fan and including a coil supplying power to the external electronic device.

Methods based on the embodiments disclosed in the claims and/or specification of the disclosure can be implemented in hardware, software, or a combination of both.

When implemented in software, computer readable recording medium for storing one or more programs (i.e., software modules) can be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the disclosure.

The program (i.e., the software module or software) can be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program can be stored in a memory configured in combination of all or some of these storage media. In addition, the configured memory can be plural in number.

Further, the program can be stored in an attachable storage device capable of accessing the electronic device through a communication network such as the Internet, an Intranet, a local area network (LAN), a wide LAN (WLAN), or a storage area network (SAN) or a communication network configured by combining the networks. The storage device can have access to a device for performing an embodiment of the disclosure via an external port. In addition, an additional storage device on a communication network can have access to the device for performing the embodiment of the disclosure.

In the aforementioned embodiments of the disclosure, a component included in the disclosure is expressed in a singular or plural form according to the specific example embodiment disclosed herein. However, the singular or plural expression is selected properly for a situation disclosed for the convenience of explanation, and thus the disclosure is not limited to a single or a plurality of components. Therefore, a component expressed in a plural form can also be expressed in a singular form, or vice versa.

While the disclosure has been shown and described with reference to certain preferred embodiments thereof, it will be understood by those skilled in the art that various changes in form and details may be made therein without departing from the spirit and scope of the disclosure as defined by the appended claims and any equivalents thereof.

What is claimed is:

1. An electronic device, comprising:
   a main body;
   an intake hole formed at a first face facing a first direction in the main body;
   a fan disposed inside the main body and pulling air through the intake hole;
   a charging device disposed between the fan and a second face facing a second direction opposite to the first direction in the main body, and the charging device including a coil that supplies power to an external electronic device;
   a plurality of holders disposed to a side face in the main body, the plurality of holders holding the external electronic device mounted on the second face; and
   a holder flow path that provides the air, which is circulated by the fan to each of the plurality of holders, toward the external electronic device.

2. The electronic device of claim 1, wherein at least one of the plurality of holders is slidable to and from the side face of the electronic device.

3. The electronic device of claim 1, wherein at least one of the plurality of holders includes a holder arm extending toward the side face of the main body, and a grip portion extending in the second direction from an end of the holder arm.

4. The electronic device of claim 3, wherein the holder flow path is formed at the grip portion, and guides the air, which is transferred by a side wall formed at a contact point of the holder arm and the grip potion, in the second direction.

5. The electronic device of claim 4, wherein the grip portion includes a curved face having an inclination in a direction in which the second face is located.

6. The electronic device of claim 5, wherein, in the grip portion, a face facing the main body includes a groove that guides the air provided through the holder flow path.

7. The electronic device of claim 1, wherein the holder flow path provides the air to a front face of the external electronic device.

8. The electronic device of claim 1, wherein at least one of the plurality of holders is slidable through an opening formed at the side face of the main body, and
   wherein the main body includes an intake slit formed at the at least one of the plurality of holders and the side face of the main body.

9. The electronic device of claim 1, wherein the second face of the main body includes a side vent through which the air is provided from the fan.

10. The electronic device of claim 9, wherein the vent is formed along an edge of the second face.

11. The electronic device of claim 9, wherein the vent is formed of at least one opening, and
    wherein the air passing through the opening is provided to a rear face of the external electronic device.

12. The electronic device of claim 1, wherein the main body includes a main body flow path that guides the air pulled into the main body to the holder flow path.

13. The electronic device of claim 12, wherein the fan is included in the main body flow path.

14. The electronic device of claim 1, wherein the charging device operates in a quick charging mode or a normal charging mode.

15. A wireless charging device for a car, the wireless charging device comprising:
    a main body;
    an intake hole formed at a first face facing a first direction in the main body;
    a mounting member formed at the first face to fix the main body to an external object;
    a fan disposed inside the main body and pulling air through the intake hole;
    a plurality of holders disposed to a side face in the main body, the plurality of holders holding an external electronic device mounted to a second face facing a second direction opposite to the first direction in the main body; and
    a holder flow path that provides the air, which is circulated by the fan to each of the plurality of holders, toward a front face of the external electronic device.

16. The charging device of claim 15, wherein at least one of the plurality of holders includes a holder arm extending toward the side face of the main body, and a grip portion extending in the second direction opposite to the first direction from an end of the holder arm.

17. The charging device of claim 16, wherein the holder flow path is formed at the grip portion, and guides the air, which is transferred by a side wall formed at a contact point of the holder arm and the grip potion, in the second direction, and releases the air to a front face of the external electronic device mounted to the second face.

18. The charging device of claim 17, wherein the grip portion includes a curved face having an inclination in a direction in which the second face is located.

19. The charging device of claim 18, wherein, in the grip portion, a face facing the main body includes a groove that guides the air transferred through the holder flow path.

20. The charging device of claim 15, further comprising a charging device for supplying power to the external electronic device.

* * * * *